United States Patent
Hirvilampi (10) Patent No.: US 6,351,189 B1
(45) Date of Patent: Feb. 26, 2002

(54) SYSTEM AND METHOD FOR AUTO-BIAS OF AN AMPLIFIER

(75) Inventor: Mika Hirvilampi, Irving, TX (US)

(73) Assignee: Nokia Networks Oy, Espoo (FI)

( * ) Notice: Subject to any disclaimer, the term of this patent is extended or adjusted under 35 U.S.C. 154(b) by 0 days.

(21) Appl. No.: 09/628,843

(22) Filed: Jul. 31, 2000

(51) Int. Cl.$^7$ ............................................. H03F 3/04
(52) U.S. Cl. ..................................... 330/296; 455/126
(58) Field of Search ............................... 330/289, 296; 455/126, 127

(56) References Cited

U.S. PATENT DOCUMENTS

| | | | |
|---|---|---|---|
| 3,984,783 A | 10/1976 | Bickley | 330/296 |
| 4,458,213 A | 7/1984 | Quan | |
| 5,406,225 A | 4/1995 | Iida et al. | 330/296 |
| 5,422,522 A | 6/1995 | Rotay | 330/289 |
| 5,589,796 A | * 12/1996 | Alberth, Jr. et al. | 330/285 |
| 5,625,322 A | * 4/1997 | Gourgue et al. | 330/129 |
| 5,920,808 A | * 7/1999 | Jones et al. | 455/126 |
| 6,052,032 A | 4/2000 | Jarvinen | 330/296 |
| 6,091,302 A | * 7/2000 | Arevalo | 330/296 |
| 6,111,466 A | 8/2000 | Mokthar et al. | 330/296 |
| 6,148,220 A | * 11/2000 | Sharp et al. | 330/285 |
| 6,194,968 B1 | * 2/2001 | Winslow | 330/285 |

FOREIGN PATENT DOCUMENTS

EP     0 601 410 A     6/1994

OTHER PUBLICATIONS

V. Meghdadi, et al: "Modeling of solid state power amplifiers (SSPA) and validation by means of a system simulator" Annales Des Telecommunications, vol. 53, No. 1/02, 1998, pp. 4–13.

Korzekwa: "Audio–Frequency Amplifiers" Electronic Engineers' Handbook, McGraw–Hill Book Company, 1989, Third Edition, pp. 13–21—13–24.

Mouly and Pautet: "The GSM System—The Radio Interface" book, International Standard Book No. 2–9507190–0–7, 1992, pp. 232–235.

* cited by examiner

*Primary Examiner*—Robert Pascal
*Assistant Examiner*—Khanh Van Nguyen
(74) *Attorney, Agent, or Firm*—Banner & Witcoff, Ltd.

(57) ABSTRACT

The present invention provides a method and apparatus for auto-biasing an amplifier. The auto-bias system of the present invention has an auto-bias feedback loop that adjusts the bias condition of an amplifier to a wanted state between transmission periods. The system monitors a physical quantity indicative of the operating state of the amplifier and controls the amplifier bias so as to control the amplifier operating point sufficiently to compensate for variations in amplifier electrical characteristics, amplifier load, amplifier temperature, and input signals. The system further adjusts the amplifier operating point based on the modulation scheme used to modulate information included in an input signal provided to amplifier, thereby allowing the amplifier to operate in any one of multiple signal modulation systems.

31 Claims, 5 Drawing Sheets

SYSTEM AND METHOD FOR AUTO-BIAS OF AN AMPLIFIER

TECHNICAL FIELD OF THE INVENTION

The present invention relates generally to electrical amplification, and more particularly to an auto-bias system and method for an amplifier.

BACKGROUND OF THE INVENTION

Mobile cellular communications, like many other electronic applications, requires a bias circuit to bias an amplifier that is used, for example, in the transmitter of a cellular base station or mobile telephone. In one conventional RF amplifier using a bipolar transistor, the general bias method for the RF amplifier has been to set a fixed DC-voltage to the base of the transistor. The collector current of the RF transistor is controlled by way of adjusting the DC-voltage during the production process in manufacturing the device using, for example, a variable resistor and diode. Once the bias is adjusted and set in production the bias of the amplifier remains substantially the same unless manually altered in the field. One such circuit is shown in FIG. 1.

Figure 1:
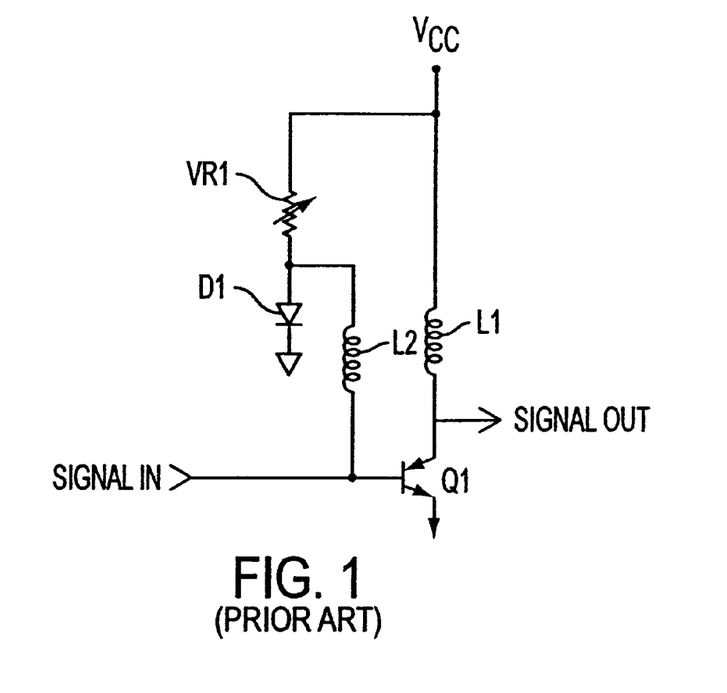
FIG. 1 is an electrical schematic diagram of a conventional RF amplifier bias circuit.

In the conventional amplifier shown in FIG. 1, the base voltage of an RF transistor is set by transferring the knee voltage of the diode D1 to the base of the bipolar transistor Q1 via the coil L2. The base voltage of transistor Q1 is adjusted by varying the resistance of variable resistor VR1 so as to control the bias current of the diode. Once the bias voltage is set during production of the circuit by adjusting the variable resistor VR1, it generally is not changed again even though the component characteristics will change over time. In the conventional bias method the power provided by Vcc to the RF transistor Q1 via coil L1 and to the bias circuit series variable resistor VR1 and diode D1 are provided by separate paths and generally operate independently such that changes in the RF transistor Q1 operating characteristics due to, for example, changes in the RF transistor Q1 operating temperature, does not track the changes in the bias voltage provided by the series variable resistor VR1 and diode D1. Thus, the bias voltage provided to the base of the RF transistor does not track the electrical characteristic changes of the RF transistor Q1 and the bias voltage does not provide a sufficiently stable operating point for the RF transistor in all circumstances.

Further, the conventional bias method illustrated in FIG. 1 has the following problems and/or disadvantages. First, the bias circuit needs tuning during production which takes time and increases the risk of error in setting the correct bias voltage supplied to the base of RF transistor Q1. Second, the conventional circuit has some inherent temperature stabilization because D1 and Q1 have almost the same, but not exactly the same temperature characteristics. Thus the conventional circuit often needs an extra temperature compensation circuit added to provide the necessary variation in the bias voltage so as to stabilize the amplifier operation as required by some applications. For example, one such temperature compensation circuit is provided by adding a positive temperature coefficient (PTC) resistor connected in series with VR1. This causes the total resistance from Vcc to D1 to increase when the temperature rises, thus decreasing the base voltage of Q1 and collector current of Q1. However, even with the addition of such a temperature compensation circuit the conventional method of biasing results in a bias condition that tends to drift as a function of temperature, because the temperature compensation circuit is not exactly at the same temperature as the RF transistor Q1 at various times during circuit operation given that the RF transistor Q1 and the temperature compensation circuit are in different physical locations. Third, the thermal matching of the transistor Q1 and diode D1 pair has unit to unit variation so even though the transistor Q1 and diode D1 pair are matched as best as possible at their nominal values, the use of a particular transistor for transistor Q1 and a particular diode for diode D1 does not generally result in perfect thermal matching. Fourth, in high power conditions the RF transistor Q1 is at higher temperature than the diode D1 and causes more inaccuracy to the thermal compensation (i.e., power related temperature transients). Finally, the conventional bias method requires that during the design phase every different transistor type (e.g., transistors having different electrical and temperature characteristics) that is to be used as the transistor Q1 in the amplifier requires a different individual thermal compensation design so as to provide a design that is properly temperature compensated. Different transistor types occur, for example, when the RF transistor Q1 will be provided by more than one manufacturer and there is manufacturer-to-manufacturer variation or when a different style of transistor is going to be used, e.g., bipolar, MOSFET, LDMOS, or GASFET.

SUMMARY OF THE INVENTION

The present invention overcomes many of the foregoing problems and/or disadvantages by providing a method and apparatus for auto-biasing an amplifier. The invention is particularly useful in biasing non-linear amplifiers and amplifiers whose input signal are amplitude modulated (AM) or includes sufficient amplitude variations. The auto-bias system of the present invention has an auto-bias feedback loop that continuously adjusts the bias condition of an amplifier to a wanted state during amplifier operation by monitoring the operating state of the amplifier and controlling the amplifier bias so as to control the amplifier operating point sufficiently to compensate for variations in amplifier electrical characteristics, amplifier load, amplifier temperature, and input signals. The system further adjusts the amplifier operating point based on the modulation scheme used to modulate information included in an input signal provided to the amplifier, thereby allowing the amplifier to operate in any one of multiple signal modulation systems. Further, the invention eliminates the need for manually adjusting the amplifier bias during production and enables use of any transistor type in the amplifier.

According to one variation of the invention, an auto-bias feedback loop is provided which includes a bias control feedback circuit connected to an amplifier. The bias control feedback circuit measures an operating parameter of the amplifier and adjusts a bias level of the amplifier based on the measured operating parameter when the bias control feedback circuit is closed. When the bias control feedback circuit is open, the bias control feedback circuit holds the bias level of the amplifier that was set when the bias control feedback circuit was closed. According to another variation of the invention, the auto-bias feedback loop is included in a transmitter of a communication device, which communication device further includes a processor coupled to the transmitter. The processor controls the opening and closing of the bias control feedback circuit.

According to a further variation of the invention, an auto-bias feedback loop is provided which includes a bias control feedback circuit connected to an amplifier. The bias control feedback circuit receives an information signal from an information signal source, which information signal is based on a signal modulation scheme. The bias control feedback circuit measures an operating parameter of the amplifier and adjusts a bias level of the amplifier based on the measured operating parameter and the signal modulation scheme. According to yet another variation of the invention, the auto-bias feedback loop is included in a transmitter in a communication device. The communication device further includes an information source and a processor that are each coupled to each other and to the transmitter. The information source sources the information input signal to the bias control feedback circuit. The processor produces a control signal that is based on the signal modulation scheme and is conveyed to the bias control feedback circuit. The bias control feedback circuit then adjusts a bias level of the amplifier based on the measured operating parameter and on the control signal.

The invention is particularly useful for setting an amplifier bias in general because the bias control is automated and generally more accurate over time and temperature. Generally, the bias method of the present invention improves the amplifier characteristics, for example, current, temperature compensation, frequency response, and power. The invention provides various particular advantages which includes: (1) enabling the use of any type of transistor in the amplifier and eliminating the need for separate bias circuit design for various particular transistor types or transistors from different manufacturers; (2) eliminating the need to tune the amplifier in production because it is automatically tuned based on the design of the auto-bias system; (3) eliminating the need for providing an automatic temperature compensation feature because such compensation is inherent in the auto-biasing system of the present invention; and (4) eliminating the long term drift effects of bias parameters as well as a lag in the bias tracking that may result due to rapid amplifier loading.

The invention is also particularly useful for RF amplifiers and for biasing amplifiers that must operate both in linear and non-linear regions. As a result of using the auto-bias invention, a desired transistor bias may be automatically provided in each of multiple signal modulation schemes and each of multiple communication systems.

BRIEF DESCRIPTION OF THE DRAWINGS

The foregoing summary of the invention, as well as the following detailed description of preferred embodiments, is better understood when read in conjunction with the accompanying drawings, which are included by way of example, and not by way of limitation, with regard to the claimed invention.

DETAILED DESCRIPTION OF THE INVENTION

The auto-bias system of the present invention includes an auto-bias feedback loop that adjusts the bias condition of an amplifier to a wanted state between periods of transmission during the course of an active communication. The auto-bias feedback loop monitors a bias measurement of a physical quantity indicative of the operating state of the amplifier and, based on the monitored bias measurement and an information modulation scheme, adjusts the amplifier bias so as to control the amplifier operating point to compensate for variations in amplifier electrical characteristics, amplifier load, amplifier temperature, and input signals. As a result, the bias method of the present invention improves the overall amplifier electrical characteristics.

Figure 2:
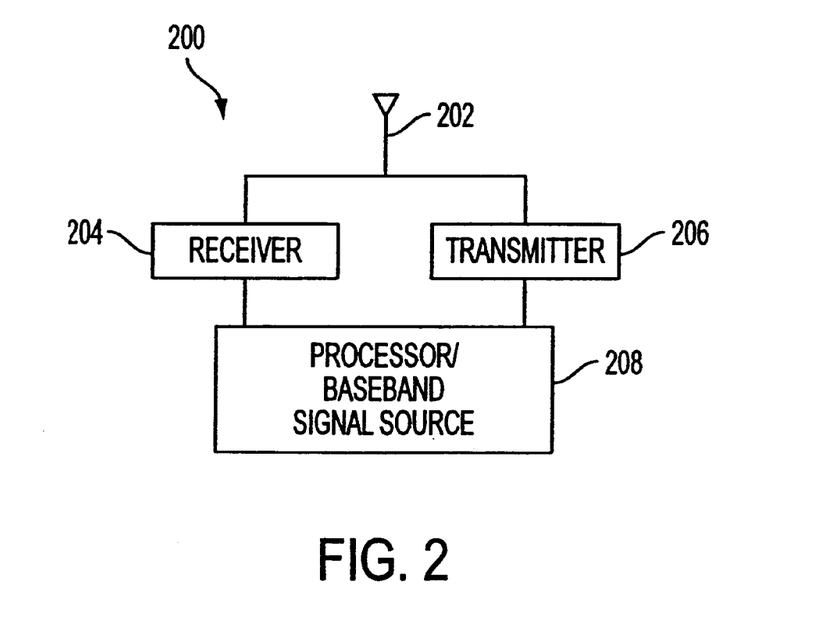
FIG. 2 is a block diagram of a communication device in accordance with the present invention.

FIG. 2 is a block diagram illustration of a communication device 200 in accordance with the present invention. Communication device 200 includes an antenna 202, a receiver 204 and a transmitter 206 coupled to antenna 202, and a processor 208, such as a digital signal processor (DSP) or a microprocessor, that is coupled to receiver 204 and to transmitter 206 and that provides, among other functions, a baseband information signal. Preferably communication device 200 is operating in a time division multiple access (TDMA) communication system, such as a Global System for Mobile Communications (GSM) system, wherein a communication device involved in an active communication is allocated one or more time slots in which to transmit data. Each time slot is one of multiple time slots, preferably eight time slots, in a time frame. As a result, communication device 200, if allocated only one time slot, can transmit data only during one out of every eight time slots and cannot transmit data during the intervening time slots.

Figure 3:
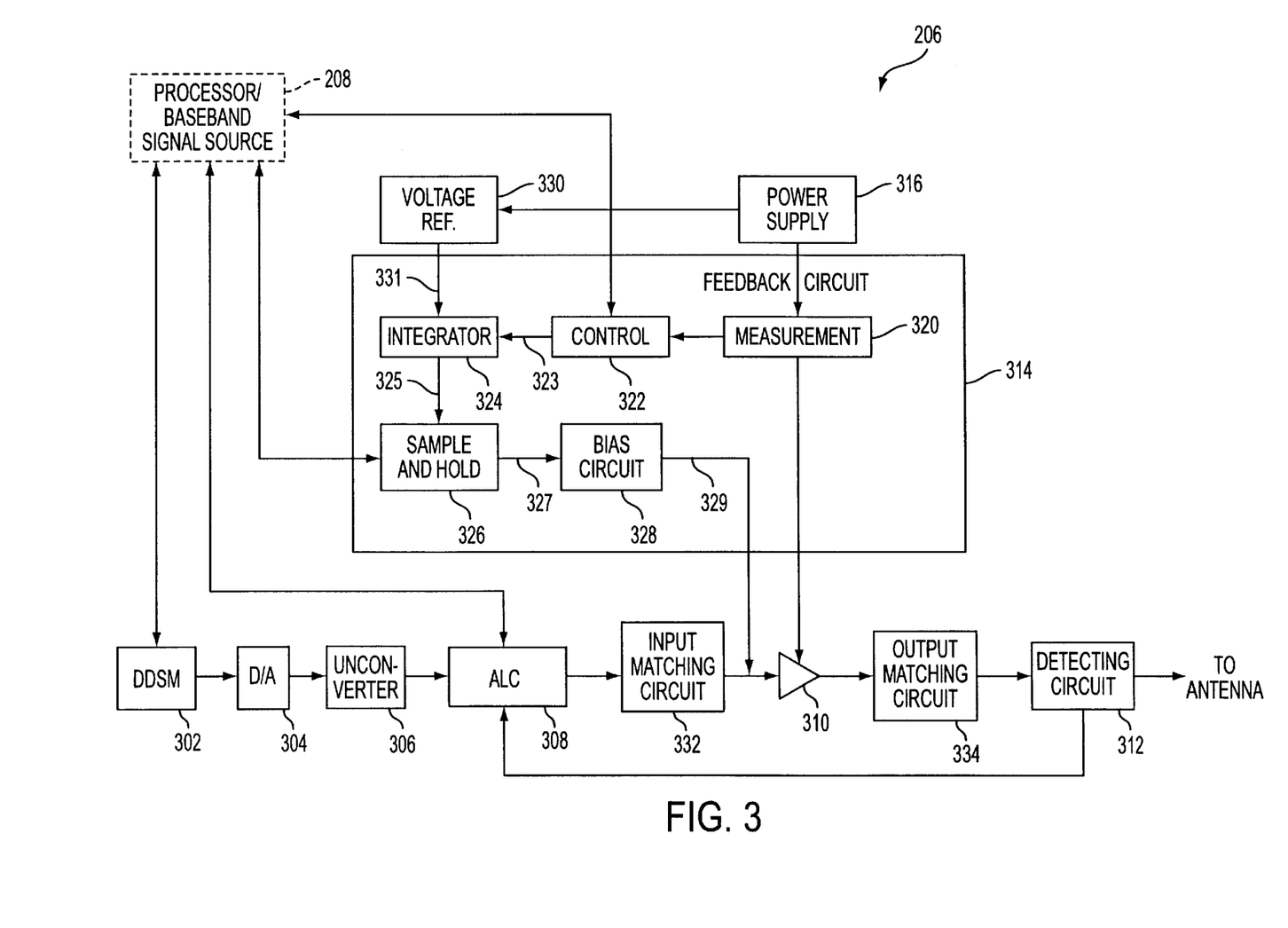
FIG. 3 is a block diagram of a transmitter of FIG. 2 in accordance with the present invention.

FIG. 3 is a block diagram of transmitter 206 in accordance with the present invention. Transmitter 206 includes a digital data signal modulator (DDSM) 302, a digital-to-analog converter (D/A) 304 coupled to DDSM 302, an upconverter 306 coupled to D/A 304, and an automatic level control circuit (ALC) 308 coupled to upconverter 306. DDSM 302 is further coupled to processor 208, and conveys to processor 208 information concerning a signal modulation scheme, such as GMSK or 8PSK, used to modulate baseband information received by DDSM 302 from processor 208.

Processor 208 serves as an information source and sources a baseband digital information signal to DDSM 302. DDSM 302 modulates the baseband information received from processor 208 based on signal modulation scheme, such as GMSK or 8PSK, to produce a modulated input signal and conveys the modulated input signal to D/A 304. D/A 304 converts the input signal to an analog signal and conveys the analog signal to upconverter 306. Signal upconverter 306 upconverts the scaled signal to a desired frequency of an output signal of amplifier 310 to produce a drive signal, and conveys the drive signal to ALC 308.

ALC 308 preferably includes a voltage controlled scalar modulator. ALC 308 is further coupled to detecting circuit 312, preferably a power coupler such as a schottky diode or a directional coupler, and to processor 208. In response to a control signal received from processor 208 and a sampled output signal received from detecting circuit 312, ALC 308 magnitude scales the drive signal received from upconverter 306 to avoid overdriving an amplifier 310. ALC 308 then conveys the scaled drive signal to amplifier 310 via an input matching network 332.

Amplifier 310 includes multiple input ports and an output port. A first input port of the multiple input ports receives a direct current (DC) feed that is sourced by a power supply 316. A second input port of the multiple input ports is coupled to input matching network 332 and receives the drive signal from ALC 308 via matching network 332. The drive signal is amplified by amplifier 310 to produce an output signal at the output port of the amplifier. The output signal is conveyed for transmission to antenna 202 via an output matching network 334 coupled to the output port and a detecting network 312 coupled to matching network 334.

The present invention provides an auto-bias feedback loop that automatically sets an appropriate bias level for amplifier 310 for the proper amplification of the drive signal. For example, when the digital information input signal modulation scheme is such that the linearity of amplifier 310 is not critical to the amplification of the input signal, such as a constant envelope modulation scheme such as GMSK or a conventional FM scheme, then the auto-bias feedback loop applies a high efficiency, non-linear bias to amplifier 310, such as a class C bias. When the modulation scheme is such that the linearity of amplifier 310 is critical to the amplification of the input signal, such as a non-constant envelope modulation scheme such as 8PSK or 16-ary QAM, then the auto-bias feedback loop applies a lower efficiency, highly linear bias to amplifier 310, such as a class A bias. Furthermore, the auto-bias feedback loop also automatically adjusts the bias level of amplifier 310 to compensate for changes in amplifier operating parameters due to such factors as current drift, temperature changes, and amplifier load changes, and due to natural performance variations among amplifiers.

In the preferred embodiment of the present invention, the auto-bias feedback loop includes amplifier 310 and a bias control feedback circuit 314 that is coupled to the first and second input ports of amplifier 310, to processor 208, and to power supply 316. Bias control feedback circuit 314 includes a measurement device 320, a control device 322 coupled to measurement device 320, an integrator 324 coupled to control device 322, a sample and hold device 326 coupled to integrator 324, and a bias device 328 coupled to sample and hold device 326. Each of measurement device 320, control device 322 and sample and hold device 326 is further coupled to processor 208. Integrator 324 is further coupled to a reference voltage source 330, measurement device 320 is further coupled to the first input port of amplifier 310, and bias device 328 is further coupled to the second input port of amplifier 310.

In operation, measurement device 320 measures an operating parameter of amplifier 310, that is, a physical quantity indicative of the operating state of the amplifier, preferably a bias or quiescent current of the amplifier; however, those of ordinary skill in the art realize that measurement device 320 may measure any operating parameter that is useful in controlling the operation of amplifier 310 via the auto-bias feedback loop, such as such as a voltage, current, or temperature, without departing from the spirit and scope of the present invention. Measurement device 320 determines a bias level metric, preferably a voltage, based on the measured operating parameter, preferably a bias current, and conveys the bias level metric to control device 322. Control device 322 adjusts its output signal 323 in response to variations in the bias level metric so as to maintain a particular desired bias level to amplifier 310 via integrator 324, sample and hold device 326, and bias device 328. As such, any variation in the measured operating parameter will cause a variation of the amplifier bias via feedback circuit 314, so that amplifier 310 maintains an optimum operating point that provides optimum amplifier electrical characteristics based on particular levels of current, temperature, power, etc., experienced by the amplifier during operation.

Control device 322 further adjusts its output signal 323 based on the signal modulation scheme used by DDSM 302 to modulate information contained in the digital information signal sourced by processor 208. For example, suppose the modulation scheme is such that the linearity of amplifier 310 is critical to the amplification of the input signal, such as a non-constant envelope signal modulation scheme such as 8PSK or 16-ary QAM. Processor 208 then conveys a control signal to control device 322 that is designed to cause a highly linear, low efficiency bias to be applied to amplifier 310, such as a class A bias. When the modulation scheme is such that the linearity of amplifier 310 is not critical to the amplification of the input signal, such as a constant envelope modulation scheme such as GMSK or any type of conventional FM modulation scheme, then the control signal conveyed by processor 208 to control device 322 is designed to cause a higher efficiency, less linear bias to be applied to amplifier 310, such as a class AB, class B, or class C bias.

Integrator 324 receives output signal 323 from control device 322, compares output signal 323 to a reference signal 331, preferably a voltage, and produces a bias level adjustment signal 325, preferably a voltage, based on the comparison. Reference signal 331 corresponds to a desired magnitude of output signal 323, and concomitantly, to a desired magnitude of the measured operating parameter. Integrator 324 conveys bias level adjustment signal 325 to sample and hold device 326. Sample and hold device 326 samples signal 325 and conveys a bias signal 327, preferably a voltage based on the sample of output signal 325, to amplifier 310 via a bias device 328. Bias device 328 provides isolation between feedback circuit 314 and the RF drive signal input into amplifier 310. Integrator 324 continuously adjusts bias level adjustment signal 325, causing adjustments in the bias level of amplifier 310 and in the measured operating parameter, until output signal 323 received by integrator 324 from control device 322 is equal to reference signal 331, at which point integrator 324 maintains the set bias level.

In an alternative embodiment of the present invention, bias control feedback circuit 314 does not include sample and hold circuit 326 and bias device 328. Integrator 324 conveys a bias voltage to amplifier 310 based on the comparison of output 323 to reference voltage 331. In another alternative embodiment of the present invention, bias control feedback circuit 314 may include measurement device 320 coupled to integrator 324. Measurement device 320 conveys a voltage based on the measured operating parameter directly to integrator 324. Integrator 324 then compares the voltage received from measurement device 320 to reference voltage 331 and conveys a bias voltage based on the comparison to amplifier 310. In yet another alternative embodiment of the present invention, sample and hold device 326 may be coupled between the measurement device 320 and control device 322, or may be coupled between control device 322 and integrator 324.

In the preferred embodiment, bias control feedback circuit 314 makes adjustments to the bias level of amplifier 310 only when amplifier 310 is not transmitting a signal. When amplifier 310 is transmitting a signal, bias control feedback circuit 314 maintains a bias level that was set when amplifier 310 was not transmitting. In the preferred embodiment, sample and hold device 326 includes a switching device that closes bias control feedback circuit 314 when amplifier 310 is not transmitting and opens bias control feedback circuit 314 when amplifier 310 is transmitting; however, those of ordinary skill in the art realize that the switching device included in sample and hold device 326 may be positioned anywhere in bias control feedback circuit 314 preceding sample and hold device 326, such as in measurement device 320 or in control device 322, without departing from the spirit and scope of the present invention. When amplifier 310 is not transmitting, bias control feedback circuit 314 adjusts the bias level of amplifier 310 in response to the bias level metric determined by measurement device 320 and the signal modulation scheme, as described above. When amplifier 310 is transmitting, bias control feedback circuit 314, and in particular sample and hold device 326, maintains the bias level of amplifier 310 that was set during a non-transmission period.

Although the invention is described with respect to a TDMA system, those of ordinary skill in the art realize that the present invention is generally applicable to amplifier designs and applications, including Code Division Multiple Access (CDMA) systems and Enhanced Data-rates for Global Evolution (EDGE) systems. The invention allows a single communication device 200 to engage in active communications in a variety of different communication systems that may each require a different amplifier bias, such as a conventional TDMA system, for which a class AB bias may suffice to meet linearity requirements, and a highly linear system such as EDGE, which may require a class A bias. The invention is also applicable to a communication wherein amplifier 310 operates during periods of low power transmission and high power transmission. The invention may be used to make continuous adjustments to a bias level of amplifier 310 during a low power period and to then to set and hold an adjusted bias level of the amplifier during a succeeding high power period. Furthermore, in a half-duplex system, the invention may also be used to adjust the bias of amplifier 310 when communication device 200 is in a receive mode, and then to hold the set bias level when the communication device resumes transmitting.

Figure 4:
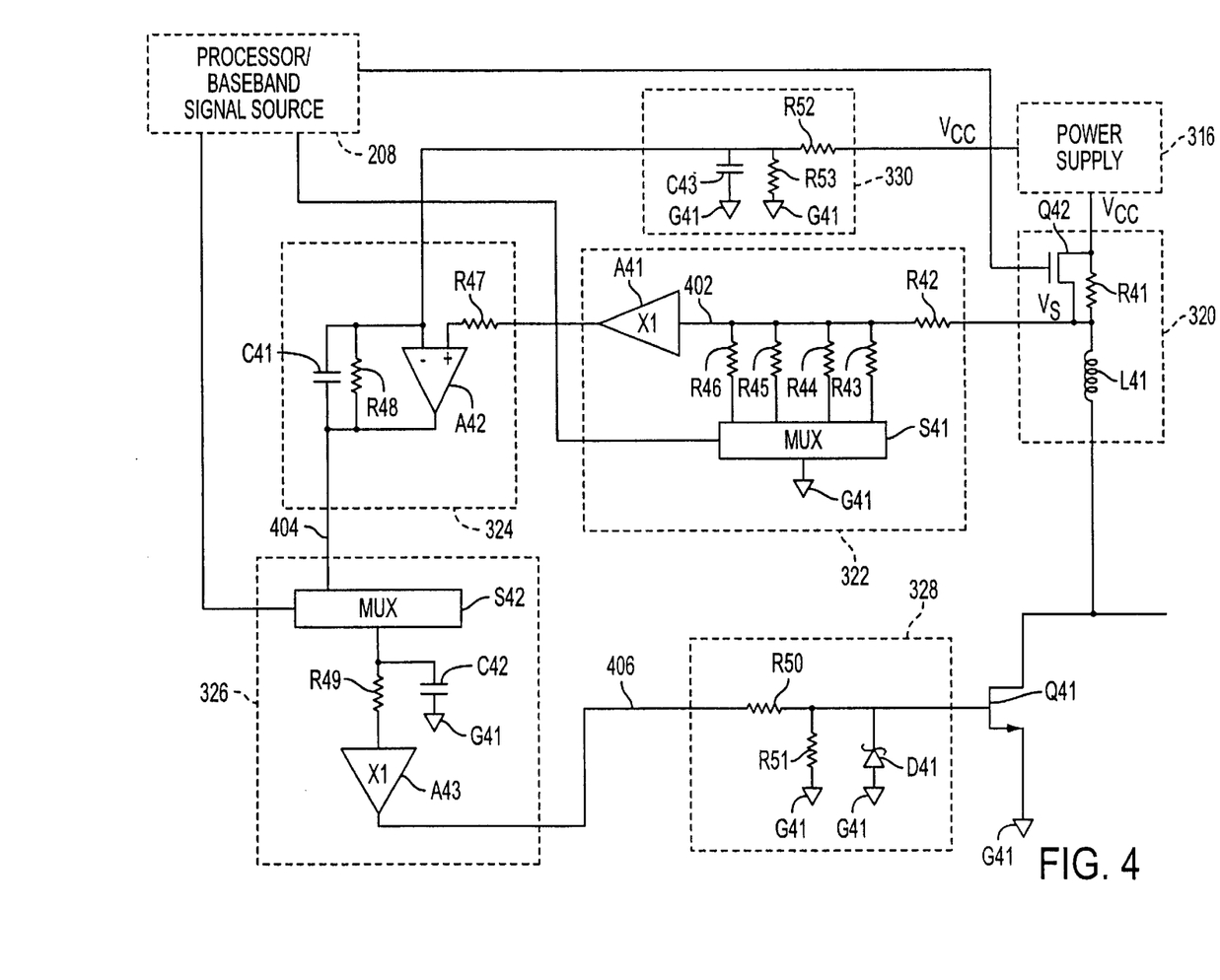
FIG. 4 is an electrical schematic diagram of an auto-bias feedback loop in accordance with the present invention.

FIG. 4 is an electrical schematic diagram of the auto-bias feedback loop in accordance with the present invention. Amplifier 310 preferably includes a field effect transistor (FET) Q41 that is coupled at its source to a ground G41, at its drain to measurement device 320, and its gate to integrator 324. A drive signal to be amplified by amplifier 310 is sourced to the gate of transistor Q41 by DDSM 302 via D/A 304, ALC 308, upconverter 306, and input matching network 332 as described above. In GSM applications, transistor Q41 may be an RF transistor and more particularly may be a bipolar junction transistor (BJT), or a FET such as a MOSFET, an LDMOS, or a GASFET, etc.

Measurement device 320 preferably includes a sensing resistor R41 that includes an input port and an output port, and a coil L41. The input and output ports are each electrical nodes for providing electrical contacts. The input port of resistor R41 is coupled to power supply 316. The output port of resistor R41 is coupled to transistor Q41 via series coil L41 and to control device 320. When transistor Q41 draws a bias current from power supply 316, a voltage drop corresponding to the magnitude of the current appears across sensing resistor R41, causing a sensed voltage (Vs) to appear at the output port of resistor R41 that is different from the voltage (Vcc) sourced by power supply 316. Since Vcc and a value of resistor R41 are known, those who are of ordinary skill in the art realize that a magnitude of the sensed voltage Vs corresponds to the magnitude of the bias current.

Measurement device 320 further includes a bypass transistor Q42, preferably a field effect transistor (FET), coupled at a drain to the input port of sensing resistor R41, at a source to the output port of resistor R41, and at a gate to processor 208. When transistor Q41 is transmitting, or alternatively is in a high power mode, processor 208 enables bypass transistor Q42, causing the drain current drawn by transistor Q41 from power supply 316 to bypass resistor R41. When transistor Q41 is not transmitting, or alternatively is in a low power mode, processor 208 disables bypass transistor Q42 and transistor Q41 draws a drain current from power supply 316 via resistor R41.

Sensed voltage Vs is conveyed by measurement device 320 to control device 322. Control device 322 preferably includes a series resistor R42 and multiple parallel shunt resistors R43–R46 (four shown). Each of multiple parallel resistors R43–R46 includes an input port and an output port, wherein each input port and output port is an electrical node for providing an electrical contact. The input port of each resistor R43–R46 is coupled to series resistor R42, and the output port of each resistor R43–R46 is coupled to ground G41 via at least one switching device S41. Together, series resistor R42 and parallel shunt resistors R43–R46 form a variable voltage divider. Alternatively, instead of a variable voltage divider, control device 322 may include multiple voltage dividers that may each be coupled to, and decoupled from, feedback circuit 314 by the enabling and disabling, by processor 208, of multiple switching devices coupled to each voltage divider. Preferably switching device S41 is a multiplexer that is controlled by processor 208; however, those of ordinary skill in the art realize that each of the multiple parallel resistors R43–R46 may instead be coupled to ground G41 by a separate switching device, such as a BJT or a FET, that is enabled and disabled, or closed and opened, by a control signal received from processor 208. Series resistor R42 and the input ports of resistors R43–R46 are further coupled to an amplifier A41, preferably a buffer amplifier.

Control device 322 receives sensed voltage Vs produced by measurement device 320 and magnitude scales the sensed voltage Vs by applying the sensed voltage to the variable voltage divider. The variable voltage divider is controlled by a bias level control signal received by feedback circuit 314 from processor 208, which bias level control signal is routed to switching device S41 and causes switching device S41 to couple one of resistors R43–R46 to ground G41. The bias level control signal is based on a predetermined gain factor stored in a memory associated with processor 208 and the signal modulation scheme used by DDSM 302 to modulate the input signal conveyed to transistor Q41 by DDSM 302. By selectively coupling one or more of resistors R43–R46 to ground G41, the variable voltage divider adjusts a magnitude of sensed voltage Vs to produce a scaled signal 402, preferably a magnitude scaled version of sensed voltage Vs. Scaled signal 402 is then conveyed by control circuit 322 to integrator 324 via amplifier A41.

Integrator 324 includes an integrating amplifier A42 that includes multiple input ports and an output port. Control device 322 is preferably coupled via a resistor R47 to a positive (+) input port of the multiple input ports of amplifier A42. Reference voltage source 330 is preferably coupled to a negative (−) input port of the multiple input ports. Amplifier A42 further includes a parallel RC feedback circuit (i.e., resistor R48 in parallel with capacitor C41) coupled between the output port and the negative input port.

In addition to a scaled signal received from control circuit 322, integrator 324 receives a reference voltage produced by reference voltage source 330. Reference voltage source 330 is coupled to power supply 316 and preferably includes a voltage divider that includes a series resistor R52 coupled to a shunt resistor R53 coupled to ground G41. In parallel with shunt resistor R53 is a shunt capacitor C43 that is coupled to each of resistors R52 and R53 and to ground G41. Reference voltage source 330 produces a reference voltage that corresponds to a desired value for the scaled signal received from control device 322, which in turn corresponds to a desired value for the transistor Q41 operating parameter measured by measuring device 320.

Integrator 324 compares signal 402, as received from controller 322 via amplifier A41, to the reference voltage and produces a bias level adjustment signal 404, preferably a voltage, based on the comparison. In a preferred embodiment, scaled signal 402 corresponds to a sensed voltage Vs, which sensed voltage in turn corresponds to a magnitude of a bias current drawn by transistor Q41 from power supply 316. So long as feedback circuit 314 is closed., integrator 324 produces a bias level adjustment signal 404 that causes feedback circuit 314 to continuously adjust the bias level of transistor Q41, and thereby the magnitude of the bias current, until scaled signal 402 is equal to the reference voltage, at which point integrator 324 maintains the set bias level. By varying the scaling factor (i.e., by varying the variable voltage divider) applied to sensed voltage Vs, control device 322 is able to vary a bias current magnitude being equated to the reference voltage and thereby vary the bias level being set for transistor Q41. As a result, processor 208, by controlling switching device S41 and thereby varying the variable voltage divider resistor R43–R46 coupled to ground G41, is able to set a bias level for transistor Q41 that is appropriate for any given signal modulation scheme.

Bias level adjustment signal 404 is conveyed to sample and hold device 326 for adjusting the bias level of transistor Q41. Sample and hold device 326 preferably includes a switching device S42, preferably a multiplexer that is enabled and disabled, or closed and opened, by a control signal provided to the switching device by processor 208. Alternatively, switching device S42 may be any switching device, such as a BJT or a MOSFET, that may be enabled and disabled by a control signal produced by processor 208. Switching device S42 is coupled to a voltage hold element C42, preferably a shunt capacitor that is coupled to ground G41. Switching device S42 is further coupled to a series resistor R49 that is coupled to voltage hold element C42 and to an amplifier A43, preferably a buffer amplifier.

Between assigned time slots, that is, when transistor Q41 is not transmitting, processor 208 conveys a first feedback control signal to switching device S42 that enables the switching device. When switching device S42 is enabled, sample and hold device 326 samples bias level adjustment signal 404 and routes the sampled signal via switching device S42 to voltage hold element C42, where a voltage corresponding to the sampled scaled signal is stored. During an assigned time slot, that is, when transistor Q41 is transmitting, processor 208 disables switching device S42, either by conveying a second feedback control signal to switching device S42 or by ceasing to convey the first feedback control signal, and voltage hold element C42 holds the stored voltage. Voltage hold element C42 provides a hold function so that the voltage stored in voltage hold element C42 when switching device S42 is enabled is used to hold a gate voltage of transistor Q41 at a desired transistor gate bias voltage when switching device S42 is disabled.

In another embodiment of the present invention, instead of a capacitor, voltage hold element C42 may include an analog-to-digital (A/D) converter in parallel with a digital-to-analog (D/A) converter, which parallel A/D and D/A converters are coupled between switching device S42 and processor 208. When switching device S42 is enabled, the sampled bias level adjustment signal 404 is coupled to the A/D converter. The A/D converter converts a magnitude of a voltage of the sampled signal to a digital value and conveys the digital value to processor 208, where the value is stored in an associated memory. When switching device S42 is disabled, processor 208 conveys the stored digital value to the D/A converter, and the D/A converter converts the digital value to an analog signal that is used to hold the gate voltage of transistor Q41 at a desired transistor gate bias voltage.

A signal 406, preferably a voltage, based on the voltage stored in voltage hold element C42 is conveyed by voltage hold element C42 to bias device 328 via resistor R49 and amplifier A43. Bias device 328 includes a series resistor R50 coupled to a shunt resistor R51 coupled to ground G41. Bias device 328 further includes a shunt zener diode D41 coupled to each of resistors R50 and R51 and to ground G41. Bias device 328 provides isolation between the feedback circuit 314 and the RF drive signal input into the gate of transistor Q41. Bias device 328 conveys the signal received by bias device 328 from sample and hold device 326 to the gate of transistor Q41, thereby allowing sample and hold circuit 326 to set the bias level of transistor Q41.

At the end of a non-transmission period, the gate voltage of the transistor Q41 corresponds to a desired drain bias, or quiescent, current. During the succeeding transmission period (i.e., the next assigned time slot), transistor Q41 operates at the desired bias level and bias control feedback circuit 314 maintains the bias state set during the preceding non-transmission period. That is, during the transmission period, the voltage stored (sample and hold voltage) in voltage hold element C42 provides a desired gate voltage to transistor Q41. Thus, when an active input signal is provided by DDSM 302 (e.g., during an assigned time slot), the amplifier bias voltage (e.g., the gate voltage of transistor Q41) corresponds to substantially the amplifier bias voltage set when there is little or no input signal provided by DDSM 302 (e.g., between assigned time slots). In the period between each assigned time slot and the succeeding assigned time slot, the bias voltage is again controlled for the next active input signal period.

Those who are of ordinary skill in the art will understand that particular values for the resistors and capacitors in the auto-bias feedback loop are selected according to a particular application so as to achieve a desired nominal amplifier bias. As such, the value of each of resistors R41–R64 and capacitors C41, C42 is dependent on the value of each of the other resistors, the type of transistor used for transistor Q41, the bias level of transistor Q41 desired for a particular class of bias, the voltage sourced by power supply 316, and the reference voltage sourced by reference voltage source 330. Those who are of ordinary skill in the art realize that there are many alternative combinations of resistor and capacitor values available to a designer of the auto-bias feedback loop and that the loop may be easily designed once a type of transistor, voltage sourced by power supply 316, and reference voltage are selected by the designer. Coil L41 is a blocking coil that is designed to block RF signals output at the drain of transistor Q41 from entering bias control feedback circuit 314. A value of coil L41 is also dependent on application and the amplifier characteristics. Although not illustrated in FIG. 4, feedback circuit 314 may also contain, for example, a 1 Megaohm resistor in parallel with voltage hold element C42 when the element is a capacitor in order to slowly discharge the capacitor, or the input impedance of amplifier A43 might be used to slowly discharge the capacitor.

By way of example and for the purpose of illustrating the principles of the present invention, for a communication device involved in an active communication in a GSM system, the invention utilizes the time slot structure of the GSM system where amplifier 310 transmits only during assigned time slots, which assigned time slots are separated by non-assigned time slots during which amplifier 310 cannot transmit. During the non-transmission time slots, bias control feedback circuit 314 is closed and transistor Q41 is biased to a desired condition using the present invention. Bias control feedback circuit 314 monitors the drain current to the transistor Q41 via the voltage across resistor R41 and continuously drives a DC voltage to the gate of the transistor Q41 during non-transmission periods so as to achieve a desired drain current for transistor Q41. If the drain current is too low, then sensed voltage Vs, and concomitantly scaled signal 402, is too high relative to the reference voltage. Integrator 324 then causes the voltage stored by voltage hold element C42 and the voltage signal conveyed to amplifier A43 by voltage hold element C42 to increase, thus causing the bias of the gate of transistor Q41 to increase. The gate voltage of transistor Q41 will increase and provide a corresponding increase in the drain current. The drain current will continue to increase until scaled signal 402 is equal to the reference voltage. When a balanced condition is reached, a voltage that will provide the desired amplifier bias voltage to the gate of transistor Q41 is stored in voltage hold element C42 and is applied to the gate of transistor Q41.

By adjusting the scaling factor used to produce scaled signal 402, the magnitude of the drain current corresponding to a balanced condition may be adjusted. Therefore, by varying the shunt resistor R43–R46 coupled to ground in the variable voltage divider in control device 322, processor 208 may vary the bias level of transistor Q41 based on the modulation scheme used to modulate the information included in the input signal sourced by DDSM 302.

During an assigned time slot, when amplifier 310 is transmitting a signal, bias control feedback circuit 314 is open. The opening of feedback circuit 314 is accomplished by disabling switching device S42, which presents a high impedance to voltage hold element C42 and minimizes energy discharge by the element. By minimizing the energy discharge by voltage hold element C42, the voltage signal conveyed by voltage hold element C42 to integrator 324 is maintained, thereby maintaining the gate bias voltage set by integrator 324 during the non-transmission period.

Figure 5:
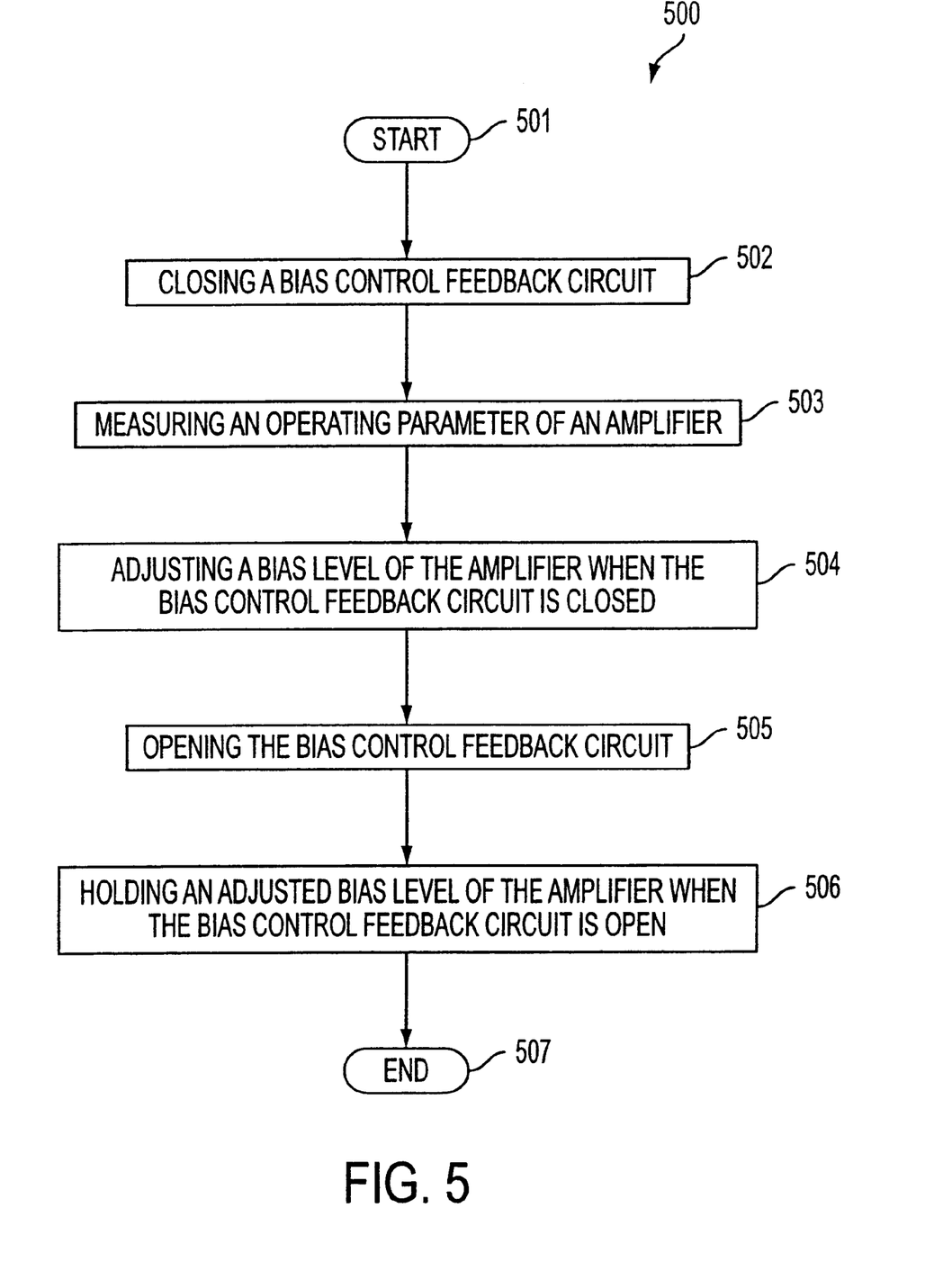
FIG. 5 is a logic flow diagram of the steps executed by an auto-bias feedback loop to automatically bias an amplifier in accordance with the present invention.

FIG. 5 is a logic flow diagram 500 of the steps executed by an auto-bias feedback loop to automatically bias an amplifier in accordance with the present invention. Preferably, the auto-bias feedback loop includes a bias control feedback circuit coupled to the amplifier. The logic flow begins (501) when a switching device included in the bias control feedback circuit closes (502) the bias control feedback circuit in response to a control signal received from a processor coupled to the auto-bias feedback loop. Preferably, the switching device closes the feedback circuit when the amplifier is not transmitting. When the bias control feedback circuit is closed, a measurement device also included in the bias control feedback circuit measures (503) an operating parameter of the amplifier. Preferably the measuring device measures a bias current sourced to the amplifier by a power supply; however, those of ordinary skill in the art realize that the measurement device may measure any operating parameter that is useful in controlling the operation of the amplifier via the auto-bias feedback loop.

The auto-bias feedback loop then adjusts (504) a bias level of the amplifier based on the measured operating parameter. Preferably, the step of adjusting (504) includes steps of determining a bias level metric, preferably a voltage, based on the measured operating parameter, sampling the determined voltage when the bias control feedback circuit is closed to produce a sampled voltage, comparing the sampled voltage to a reference voltage, and adjusting a bias level of the amplifier based on the comparison of the sampled voltage to the reference voltage. Alternatively, the step of adjusting (504) may include steps of adjusting a bias level of the amplifier based on the measured operating parameter and a signal modulation scheme, or adjusting a bias level of the amplifier based on the measured operating parameter and a predetermined gain factor.

The switching device then opens (505) the bias control feedback circuit, preferably in response to being disabled by the processor. Preferably, the switching device opens the bias control feedback circuit when the amplifier is transmitting a signal. When the bias control feedback circuit is open, the auto-bias feedback loop holds (506) the adjusted bias level, and the logic flow ends (507).

Figure 6:
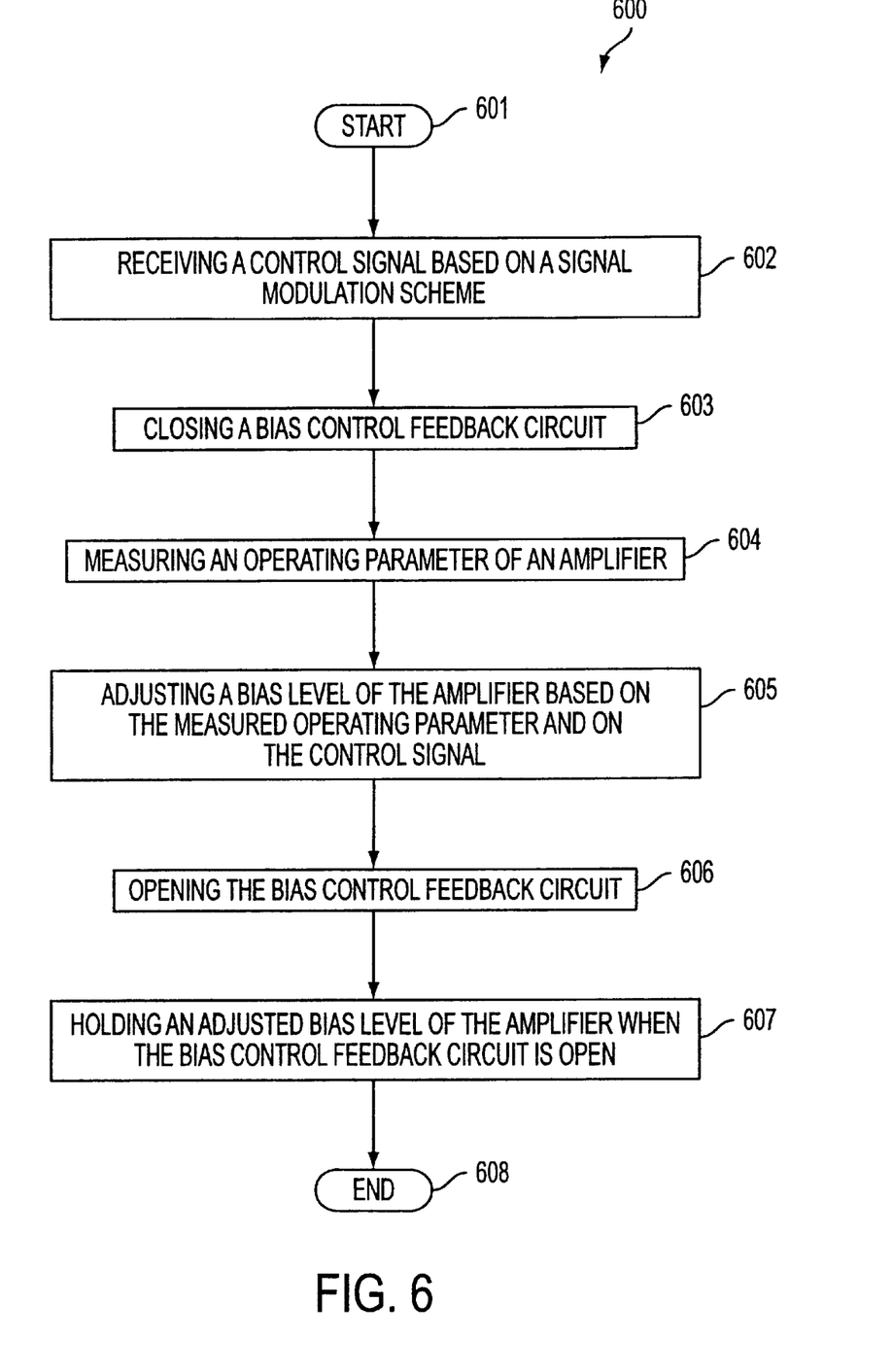
FIG. 6 is a logic flow diagram of the steps executed by an auto-bias feedback loop to automatically bias an amplifier in accordance with the present invention.

FIG. 6 is a logic flow diagram 600 of the steps executed by an auto-bias feedback loop that includes an amplifier coupled to a bias control feedback circuit to automatically bias the amplifier in accordance with another embodiment of the present invention. In logic flow diagram 600, the logic flow begins (601) when a switching device included in the bias control feedback circuit closes (602) the bias control feedback circuit, preferably in response to receiving a feedback control signal from the processor. Preferably, the switching device closes the feedback circuit when the amplifier is not transmitting. When the bias control feedback circuit is closed, a measurement device also included in the bias control feedback circuit measures (603) an operating parameter, preferably a bias current, of the amplifier. The auto-bias feedback loop, preferably a control device included in the auto-bias feedback loop, also receives (604) a bias level control signal, preferably from a processor coupled to the auto-bias feedback loop, based on a signal modulation scheme. The auto-bias feedback loop then adjusts (605) a bias level of the amplifier based on the measured operating parameter and on the bias level control signal.

The switching device then opens (606) the bias control feedback circuit, preferably in response to being disabled by the processor. Preferably, the switching device opens the bias control feedback circuit when the amplifier is transmitting a signal. When the bias control feedback circuit is open, the auto-bias feedback loop holds (607) the adjusted bias level, and the logic flow ends (608). Preferably, the step of adjusting (605) includes steps of determining a bias level metric based on the measured operating parameter, magnitude scaling the determined bias level metric based on the determined signal modulation scheme, comparing the magnitude scaled bias level metric to a reference signal, and adjusting a bias level of the amplifier based on the comparison of the magnitude scaled bias level metric and the reference signal.

In sum, the present invention provides an amplifier bias control that is automated and generally more accurate over time and temperature. Generally, the bias method of the present invention improves the amplifier characteristics, for example, current, temperature compensation, frequency response, and power. The invention is also particularly useful for RF amplifiers and even more useful for biasing amplifiers that must operate in both linear and nonlinear regions. As a result of using the invention, transmitter 206 is able to adjust a bias level of amplifier 310 to accommodate both linear and non-linear modulation schemes. The autobias invention also allows transmitter 206 to self-adjust a bias level of amplifier 310 and maintain a consistent amplifier operating point regardless of changes in amplifier operating conditions, such as ambient temperature, amplifier age, and amplifier load. This is particular useful when the amplifier experiences rapid increased loading that results in a significant temperature change on an initial signal input after an inactive period. For example, the present invention when used in a transmitter of a base station in a cellular communication system allows the amplifier bias to adjust rapidly to changes in the loading condition of the amplifier when the base station experiences a rapid increase in signaling traffic after being idle for a long period of time (e.g., in the morning when cellular phone users start using their phones after little use at night).

Although particular embodiments of the present invention have been shown and described, it will be understood that they are not intended to limit the invention to the preferred embodiments and it will be obvious to those skilled in the art that various changes and modifications may be made without departing from the spirit and scope of the present invention. Thus, the invention is intended to cover alternatives, modifications, and equivalents, which may be included within the spirit and scope of the invention as defined by the claims.

For example, the present invention may be implemented using either analog or digital techniques, or both. Likewise the present invention may be implemented using discrete components or integrated circuits, or both. Furthermore, the type of transistors used in the invention may of any type and any conductivity, i.e., bipolar, MOS, NPN, PNP, etc. Finally, although the invention is particularly useful for RF amplifiers including a power transistor, the present invention may be used to bias any type of amplifier.

What is claimed is:

1. An apparatus for automatically setting a bias level for an amplifier, wherein the apparatus is conveyed an information input signal by an information input signal source, the apparatus comprising:
    an amplifier; and
    a bias control feedback circuit coupled to the amplifier that measures an operating parameter of the amplifier and adjusts a bias level of the amplifier based on the measured operating parameter and a signal modulation scheme used to produce the information input signal,
    wherein the bias control feedback circuit comprises a control device that that adjusts a magnitude of a signal received by the control device based on the signal modulation scheme, thereby causing an adjustment in a bias level of the amplifier,
    wherein the control device comprises a variable voltage divider that adjusts a magnitude of a signal received by the control device based on the signal modulation scheme, thereby causing an adjustment in a bias level of the amplifier.

2. An apparatus for automatically setting a bias level for an amplifier, the apparatus comprising:
    an amplifier, and
    a bias control feedback circuit coupled to the amplifier that measures an operating parameter of the amplifier, said bias control feedback circuit comprising a control device that adjusts a bias level of the amplifier based on the measured operating parameter when the bias control feedback circuit is in a hold mode, and maintains the bias level of the amplifier when the bias control feedback circuit is in a sampling mode.

3. The apparatus of claim 2, wherein the bias control feedback circuit is in said hold mode when the amplifier is not transmitting, is in said sampling mode when the amplifier is transmitting, and adjusts a bias level of the amplifier when the amplifier is not transmitting.

4. The apparatus of claim 2, wherein the bias control feedback circuit determines a bias level metric based on the measured operating parameter, and wherein the bias control feedback circuit adjusts a bias level of the amplifier based on the bias level metric.

5. The apparatus of claim 2, wherein the bias control feedback circuit comprises a control device that adjusts a magnitude of a signal received by the control device based on the measured operating parameter to produce a magnitude adjusted signal, thereby causing an adjustment in a bias level of the amplifier.

6. The apparatus of claim 5, wherein the control device adjusts the bias level of the amplifier based on the measured operating parameter and on a signal modulation scheme.

7. The apparatus of claim 5, wherein the control device adjusts the bias level of the amplifier based on the measured operating parameter and on a predetermined gain factor.

8. The apparatus of claim 5, wherein the control device comprises a variable voltage divider that adjusts a magnitude of a signal received by the control device based on the measured operating parameter, thereby causing an adjustment in a bias level of the amplifier.

9. The apparatus of claim 8, wherein the variable voltage divider produces a voltage signal based on the measured operating parameter, and wherein the bias control feedback circuit further comprises a sample and hold device coupled to the control device that samples the voltage signal when the amplifier is not transmitting to produce a sampled voltage and holds the sampled voltage when the amplifier is transmitting so as to sufficiently maintain the bias level as set according to the measured operating parameter.

10. The apparatus of claim 9, wherein the sample and hold device includes a switching device that closes the bias control feedback circuit when the amplifier is not transmitting and that opens the bias control feedback circuit when the amplifier is transmitting.

11. An apparatus for automatically setting a bias level for an amplifier, the apparatus comprising:
    an amplifier; and
    a bias control feedback circuit coupled to the amplifier that measures an operating parameter of the amplifier, adjusts a bias level of the amplifier based on the measured operating parameter when the bias control feedback circuit is closed, and maintains the bias level of the amplifier when the bias control feedback circuit is open,
    wherein the bias control feedback circuit comprises a control device that adjusts a magnitude of a signal received by the control device based on the measured operating parameter to produce a magnitude adjusted signal, thereby causing an adjustment in a bias level of the amplifier,
    wherein the control device comprises a variable voltage divider that adjusts a magnitude of a signal received by the control device based on the measured operating parameter, thereby causing an adjustment in a bias level of the amplifier,
    wherein the variable voltage divider produces a voltage signal based on the measured operating parameter, and wherein the bias control feedback circuit further comprises a sample and hold device coupled to the control device that samples the voltage signal when the amplifier is not transmitting to produce a sampled voltage and holds the sampled voltage when the amplifier is transmitting so as to sufficiently maintain the bias level as set according to the measured operating parameter, wherein the sample and hold device produces a sampled voltage signal based on the sampled voltage, and wherein the apparatus further comprises:

a reference voltage source that produces a reference voltage; and an integrator coupled to the sample and hold device, to the amplifier, and to the reference voltage source, that receives the sampled voltage signal from the sample and hold device, receives the reference voltage from the reference voltage source, compares the sampled voltage signal to the reference voltage, and adjusts the bias level based on the comparison.

12. An apparatus for automatically setting a bias level for an amplifier, the apparatus comprising:

an amplifier;

a bias control feedback circuit coupled to the amplifier that measures an operating parameter of the amplifier, adjusts a bias level of the amplifier based on the measured operating parameter when the bias control feedback circuit is closed, and maintains the bias level of the amplifier when the bias control feedback circuit is open, wherein the bias control feedback circuit comprises a control device that adjusts a magnitude of a signal received by the control device based on the measured operating parameter to produce a magnitude adjusted signal, thereby causing an adjustment in a bias level of the amplifier, a reference voltage source that produces a reference voltage; and an integrator coupled to the control device and to the reference voltage source, that receives the magnitude adjusted signal from the control device, receives the reference voltage from the reference voltage source, compares the magnitude adjusted signal to the reference voltage, and adjusts the bias level based on the comparison.

13. The apparatus of claim 12, wherein the integrator compares the magnitude adjusted signal to the reference voltage to produce a bias level adjustment voltage, and wherein the apparatus further comprises a sample and hold device coupled to the integrator that samples the a bias level adjustment voltage when the amplifier is not transmitting to produce a sampled voltage and holds the sampled voltage when the amplifier is transmitting so as to sufficiently maintain the bias level as set according to the measured operating parameter.

14. A communication device comprising:

an information source that produces a digital information input signal based on a signal modulation scheme;

a processor coupled to the information source that produces a control signal based on the signal modulation scheme;

a transmitter coupled to the information source and to the processor having an auto-bias feedback loop that comprises:

an amplifier; and a bias control feedback circuit coupled to the amplifier that measures an operating parameter of the amplifier, receives the control signal from the processor, and adjusts a bias level of the amplifier based on the measured operating parameter and on the control signal, wherein the bias control feedback circuit includes a variable voltage divider that magnitude scales a signal received by the variable voltage divider based on a control signal received from the processor, thereby causing an adjustment of a bias level of the amplifier.

15. The communication device of claim 14, wherein the processor and the information source are the same element.

16. A communication device comprising:

a transmitter having an autobias feedback loop that comprises:

an amplifier;

a bias control feedback circuit coupled to the amplifier that measures an operating parameter of the amplifier, adjusts a bias level of the amplifier based on the measured operating parameter when the bias control feedback circuit is in a hold mode, and maintains the bias level of the transmitter when the bias control feedback circuit is in a sampling mode; and a processor coupled to the transmitter that controls whether the auto-bias feedback loop is in the hold mode or sampling mode.

17. The communication device of claim 16, wherein the auto-bias feedback loop is in said sampling mode when the amplifier is not transmitting, is in said hold mode when the amplifier is transmitting, and adjusts a bias level of the amplifier when the amplifier is not transmitting.

18. The communication device of claim 16, wherein the bias control feedback circuit comprises a control device that adjusts a magnitude of a signal received by the control device based on the measured operating parameter, thereby causing an adjustment in a bias level of the amplifier.

19. The communication device of claim 18, wherein the control device adjusts the bias level of the amplifier based on the measured operating parameter and a predetermined gain factor.

20. The communication device of claim 18, wherein the control device adjusts the bias level of the amplifier based on the measured operating parameter and on a signal modulation scheme.

21. The communication device comprising:

a transmitter having an auto-bias feedback loop that comprises:

an amplifier;

a bias control feedback circuit coupled to the amplifier that measures an operating parameter of the amplifier, adjusts a bias level of the amplifier based on the measured operating parameter when the bias control feedback circuit is closed, and maintains the bias level of the transmitter when the bias control feedback circuit is open; and a processor coupled to the transmitter that controls the opening and the closing of the auto-bias feedback loop, wherein the bias control feedback circuit comprises a control device that adjusts a magnitude of a signal received by the control device based on the measured operating parameter, thereby causing an adjustment in a bias level of the amplifier, wherein the control device comprises a variable voltage divider that produces a voltage signal based on the measured operating parameter, and wherein the bias control feedback circuit further comprises a sample and hold device that samples the voltage signal when transmitter is not transmitting to produce a sampled voltage and holds the sample voltage when the transmitter is transmitting so as to sufficiently maintain the bias level as set according to the measured operating parameter.

22. The communication device of claim 21, wherein the sample and hold device includes a switching device that closes the bias control feedback circuit in response to a control signal received from the processor when the transmitter is not transmitting and that opens the bias control feedback circuit in response to a control signal received from the processor when the transmitter is transmitting.

23. A communication device comprising:
a transmitter having an auto-bias feedback loop that comprises:
an amplifier;
a bias control feedback circuit coupled to the amplifier that measures an operating parameter of the amplifier, adjusts a bias level of the amplifier based on the measured operating parameter when the bias control feedback circuit is closed, and maintains the bias level of the transmitter when the bias control feedback circuit is open; and
a processor coupled to the transmitter that controls the opening and the closing of the auto-bias feedback loop,
wherein the bias control feedback circuit comprises a control device that adjusts a magnitude of a signal received by the control device based on the measured operating parameter, thereby causing an adjustment in a bias level of the amplifier,
wherein the control device comprises a variable voltage divider that produces a voltage signal based on the measured operating parameter, and wherein the bias control feedback circuit further comprises a sample and hold device that samples the voltage signal when the transmitter is not transmitting to produce a sampled voltage and holds the sampled voltage when the transmitter is transmitting so as to sufficiently maintain the bias level as set according to the measured operating parameter,
wherein the sample and hold device produces a sampled voltage signal based on the sampled voltage, and wherein the communication device further comprises:
a reference voltage source that produces a reference voltage; and
an integrator coupled to the control device, to the sample and hold device, to the amplifier, and to the reference voltage source, that receives the sampled voltage signal from the sample and hold device, receives the reference voltage from the reference voltage source, compares the sampled voltage signal to the reference voltage, and adjusts the bias level based on the comparison.

24. A method for automatically biasing an amplifier comprising steps of:
closing a bias control feedback circuit coupled to the amplifier;
measuring an operating parameter of the amplifier;
adjusting a bias level of the amplifier based on the measured operating parameter when the bias control feedback circuit is closed;

opening the bias control feedback circuit; and
holding the adjusted bias level when the bias control feedback circuit is open.

25. The method of claim 24, wherein the step of closing comprises a step of closing the auto-bias feedback loop when the amplifier is not transmitting and wherein the step of opening comprises a step of opening the bias control feedback circuit when the amplifier is transmitting.

26. The method of claim 24, wherein the step of adjusting comprises a step of adjusting a bias level of the amplifier based on the measured operating parameter and a signal modulation scheme.

27. The method of claim 24, wherein the step of adjusting comprises a step of adjusting a bias level of the amplifier based on the measured operating parameter and a predetermined gain factor.

28. The method of claim 24, wherein the step of adjusting comprises steps of:
determining a bias level metric based on the measured operating parameter; and
adjusting a bias level of the amplifier based on the determined bias level metric when the bias control feedback circuit is closed.

29. The method of claim 24, wherein the step of adjusting comprises steps of:
determining a voltage based on the measured operating parameter;
sampling the determined voltage when the bias control feedback circuit is closed to produce a sampled voltage;
comparing the sampled voltage to a reference voltage; and
adjusting a bias level of the amplifier based on the comparison of the sampled voltage to the reference voltage.

30. A method for automatically biasing an amplifier comprising steps of:
closing a bias control feedback circuit coupled to the amplifier;
measuring an operating parameter of the amplifier;
receiving a control signal based on a signal modulation scheme; and
adjusting a bias level of the amplifier based on the measured operating parameter and on the received control signal when the bias control feedback circuit is closed;
opening the bias control feedback circuit; and
holding the adjusted bias level when the bias control feedback circuit is open.

31. The method of claim 30, wherein the step of adjusting comprises steps of:
determining a bias level metric based on the measured operating parameter;
magnitude scaling the determined bias level metric based on the control signal;
comparing the magnitude scaled bias level metric to a reference signal; and
adjusting a bias level of the amplifier based on the comparison of the magnitude scaled bias level metric and the reference signal.

* * * * *